CONVERTER WITH ACTIVE STARTER CIRCUIT

Filed May 20, 1957 2 Sheets-Sheet 1

INVENTORS
JAMES L. JENSEN
DAVID E. WHITE
BY Omund R. Dahle
ATTORNEY

April 9, 1963 J. L. JENSEN ETAL 3,085,211

CONVERTER WITH ACTIVE STARTER CIRCUIT

Filed May 20, 1957 2 Sheets-Sheet 2

INVENTORS
JAMES L. JENSEN
DAVID E. WHITE

BY

Omund R Dahle

ATTORNEY 3,085,211

CONVERTER WITH ACTIVE STARTER CIRCUIT

James Lee Jensen, St. Louis Park, and David E. White, St. Paul, Minn., assignors to Minneapolis-Honeywell Regulator Company, Minneapolis, Minn., a corporation of Delaware

Filed May 20, 1957, Ser. No. 660,302
22 Claims. (Cl. 331—52)

This invention relates generally to improved transistor power converter circuits having a transistor oscillator for converting a D.C. potential to an A.C. potential. In the field of transistor power supplies numerous circuits have been developed to convert a low voltage D.C. to higher voltage D.C. or to an A.C. potential. Some of these circuits have provided a transistor oscillator to convert the D.C. power supply to an alternating type current potential which may then be stepped up in voltage by a transformer and rectified, if desired, to provide high voltage D.C. An example of this type of a transistor oscillator D.C. to A.C. inverter, is disclosed in the Patent 2,774,878.

It has been observed that under certain adverse conditions of operation a transistor oscillator inverter may fail to start. While most vacuum tube oscillators will begin to oscillate spontaneously due to thermal noise in the circuit, transistor oscillators, especially if feeding a relatively heavy load, will not always do so. One reason for this may be that while vacuum tubes can conduct a substantial current while no bias is present, transistors conduct very little current when unbiased. More specifically then our invention relates to a new and useful transistor oscillator converter circuit having an active starter circuit to insure that the transistor oscillator will start even under adverse operating conditions such as a heavy load on the output of the power converter, or upon a slowly rising D.C. source potential when the converter is energized.

It is an object of this invention, therefore, in a transistor D.C. to A.C. converter power supply to provide starting apparatus for insuring that the transistor converter will become operative even under adverse operating conditions.

It is an object of this invention to provide a pulsating type circuit interconnected into a transistor D.C. to A.C. converter for the purpose of providing a positive starting action for the converter.

It is a more specific object to provide in a push-pull transistor oscillator, a type of blocking oscillator or multi-vibrator to initiate oscillation in the push-pull oscillator.

These and other objects of the present invention will be understood upon consideration of the accompanying specification, claims and drawings of which:

Figure 1:
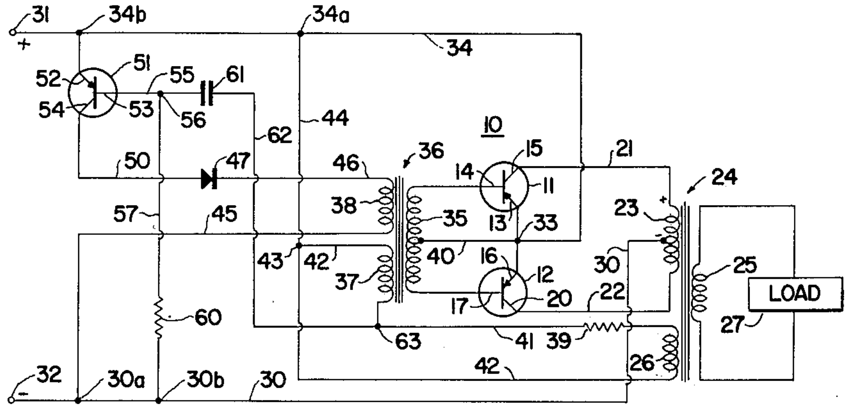
FIGURE 1 is a schematic representation of an embodiment of the invention.

Referring now to FIGURE 1, there is disclosed a transistor oscillator or inverter 10 for converting a direct current potential to an alternating current type potential. The inverter circuit is basically similar to the disclosure of Patent 2,774,878 issued to James L. Jensen, and assigned to the same assignee as the present invention. The inverter 10 comprises a pair of transistors 11 and 12 which preferably are junction type transistors. The transistor 11 has an emitter electrode 13, a base electrode 14, and a collector electrode 15. The transistor 12 has an emitter electrode 16, a base electrode 17, and a collector electrode 20. The collector electrodes 15 and 20 are connected by conductors 21 and 22, respectively, to opposite terminals of a center tapped primary winding 23 of a power output transformer 24. The output transformer 24 also includes a secondary winding 25 and a feedback winding 26. The output winding 25 is connected to suitable power consuming load means 27. If high voltage D.C. is required, the load means may include rectifying means. The center tap of the primary winding 23 is connected by a conductor 30 to the negative supply terminal 32 of a pair of power supply terminals 31 and 32, which are to be connected to a suitable source of D.C. potential.

The emitter electrodes 13 and 16 of transistors 11 and 12 are directly connected together at a junction 33. The junction 33 is connected by a conductor 34 to the positive input potential terminal 31. The base electrodes 14 and 17 are connected, respectively, to opposite terminals of a center tapped secondary winding 35 of a saturating transformer 36. The saturating transformer 36 also includes a primary winding 37 and a further winding 38. The center tap of winding 35 is directly connected to the emitters 13 and 16 at the junction 33 by a conductor 40.

The feedback winding 26 of transformer 24 is connected by the conductors 41 and 42 across the terminals of the primary winding 37 of saturating transformer 36. A current limiting resistor 39 is in series with the conductor 41. A junction 43 on the conductor 42 is connected by a conductor 44 to the conductor 34 at the junction **34*a*. The lower terminal of the winding 38 of transformer 36 is connected by a conductor 45 to the negative supply conductor 30 at the junction 30*a*. The upper terminal of the winding 38 is connected by a conductor 46, a junction diode 47 and a conductor 50 to the collector electrode of a transistor 51. The transistor 51, which preferably is a junction type transistor, has an emitter electrode 52, a base electrode 53 and a collector electrode 54. The emitter electrode 52 is directly connected to a junction 34*b* on the conductor 34. The base electrode 53 is connected by a conductor 55, a junction 56, a conductor 57, and a current limiting resistor 60 to a junction 30*b* on the conductor 30. The base electrode 53 is also connected by the conductor 55, a coupling capacitor 61, and a conductor 62 to a junction 63 on the conductor 41. The transistor 51 and the associated components form a starting circuit for the transistor inverter 10**.

*Operation of FIGURE 1*

In considering the operation of the circuit of FIGURE 1, let it first be assumed that the oscillator inverter 10 is energized and is operating in a normal manner. During the half cycle when transistor 11 is conductive, a current path may be traced from the positive D.C. supply terminal 31 through the conductor 34, junction 33, through transistor 11 from the emitter 13 to the collector 15, conductor 21, the upper portion of primary winding 23 of transformer 24, and from the center-tap of the winding through conductor 30 to the negative supply terminal 32. The potential across primary winding 23 during this half cycle, as indicated by legends on the drawing, is positive at the upper terminal of the winding. The resultant induced voltage on secondary winding 26 is connected to the primary winding 37 of the saturating transformer 36. The induced voltage in the secondary winding 35 of transformer 36 is negative at the upper terminal of the winding which is connected to base electrode 14 of transistor 11. The feedback potential, therefore, is in a direction to maintain transistor 11 conductive.

Operation will continue with transistor 11 conducting and transistor 12 cut off until a period of time has elapsed such that the core of transformer 36 becomes saturated due to the feedback. The shunt impedance of the saturating transformer is effectively reduced and a greater current tends to flow through its windings, however, the current limiting resistor 39 prevents any substantial increase in current through the transformer. Thus since the effective transformer impedance has been lessened without any substantial increase in current therethrough, the transformer voltage reduces and the driving voltage across emitter 13 to base 14 is decreased. The output current through the transistor 11 and thus through output transformer primary winding 23 is therefore reduced. The rate of change of flux in transformer 24 is now reversed to cause a voltage of the opposite polarity to be induced in its windings. This voltage now fed back through saturating transformer 36 causes transistor 11 to be driven to cutoff and transistor 12 to become conductive. This state now continues until the core of saturating transformer 36 saturates in the reverse direction completing a second half cycle, whereupon the initial state again prevails and the cycle repeats. An alternating current potential is thereby induced in the secondary winding 25 of the transformer 24 and is supplied to a suitable load consuming device. Transformer 24 may be a stepup transformer, and the alternating potential output of winding 25 may be rectified, thereby providing in this system a low voltage to high voltage D.C. converter.

Various operating conditions may occur under which the oscillator 10 may fail to start. This may be caused by a heavy load on the output of the apparatus, or by a sudden overload during operation which causes the oscillator to stop, or by a slowly rising D.C. energizing potential, or by various other factors. In this invention an active starting circuit is coupled to the oscillator to insure that the oscillator will start even under adverse operating conditions.

Let it now be assumed that a D.C. potential is applied at input terminals 31 and 32 but that the oscillator 10 is not operative. A current path may be traced from the positive supply terminal 31 through the conductor 34, the junction **34*b*, through the input circuit of the transistor 51 from the emitter 52 to the base 53, through conductor 55, junction 56, conductor 57, current limiting resistor 60, to the junction 30*b* and through the conductor 30 to the negative supply terminal 32. Current also flows through the output of the transistor 51 from emitter 52 to collector 54, through the conductor 50, junction diode 47, the conductor 46, the winding 38 of saturating transformer 36 and through the conductor 45 to the junction 30*a* on the negative supply conductor 30. The transistor output current flowing through the winding 38 also causes a potential to be induced in the secondary winding 35** to bias one of the oscillator transistors to conduction. This bias potential to the oscillator transistor is effective to initiate the oscillation.

The operation of this starting circuit is a repetitive action, as the circuit operates in a blocking oscillator type fashion. This operation may be understood when it is considered that as the transistor 51 begins to conduct, as described above, the induced voltage on the feedback transformer winding 37 causes a relatively large current to flow, the transistor input circuit charging capacitor 61. This current path may be traced through 42, 43, 44, **34*a*, 34, 34*b*, 52, 53, 55, 56, 61, 62 and 63. As capacitor 61 becomes charged the transistor 51 will conduct less. Since the induced voltage on winding 37 has tended to turn on transistor 51 by the charging current through capacitor 61, it is clear that as the charging current reduces the drive is less. The cumulative action reduces the loop gain to less than one and the induced voltages in transformer 36 reverse. The voltage now induced in winding 37 adds to the charge on capacitor 61 to back bias and turn off transistor 51. After a period of time the charge on capacitor 61 diminishes to a point where base current again begins to flow in transistor 51. The pulsing cycle then repeats itself with resistor 51 conducting and capacitor 61** becoming recharged.

Let us assume it is decided to connect the transformer winding 38 in such a polarity relationship to the secondary winding 35 so that the current pulse from transistor 51 is effective to make transistor 11 conductive. The initial feedback potential will then be of a polarity as previously described and as shown in the legends on the drawing. It can be readily seen then that the feedback potential from the secondary winding 26 of transformer 24 is of a polarity to apply a positive pulse through the coupling capacitor 61 to the base 53 of the transistor 51. The transistor 51 is thereby cut off during the remainder of the first half cycle of operation of the oscillator. During the second half cycle of operation of the oscillator 10, the starting transistor 51 is also maintained at cutoff because the potential induced on the winding 38 due to the feedback potential on winding 37 of transformer 36 will be of a polarity to maintain the collector 54 positive with respect to the emitter 52 so that no current flows through the transistor 51. Thus it can be clearly seen that during the time the oscillator 10 is operating in a normal manner the starting transistor 51 is biased to cutoff, and only when the oscillation of oscillator 10 ceases do pulses of current flow through the transistor 51 to initiate oscillation again in the oscillator 10.

*FIGURE 2*

Figure 2:
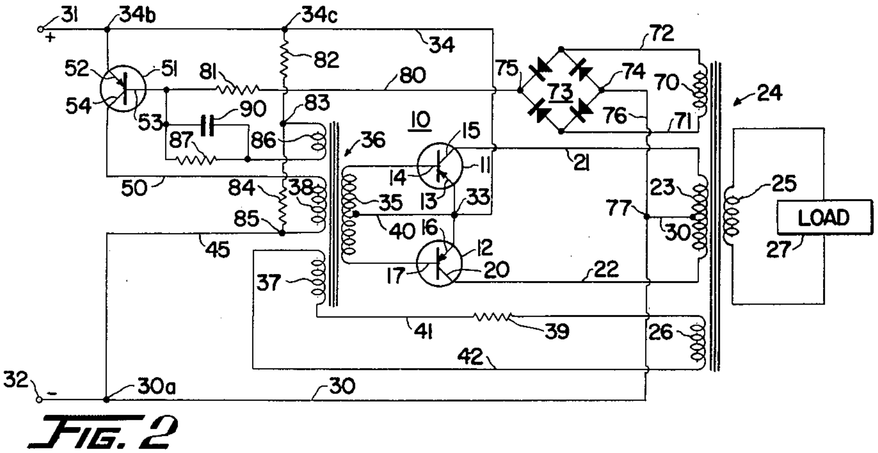
FIGURE 2 is a schematic representation of another embodiment of our invention.

Referring now to the circuit disclosed in FIGURE 2, it will be noted that the inverter oscillator 10 is substantially identical to the inverter of FIGURE 1. Like components have been given the same identifying numerals in FIGURE 2 as were used and described in FIGURE 1. In FIGURE 2, the output transformer 24 includes an additional secondary winding 70. The terminals of the winding 70 are connected by conductors 71 and 72 to the input terminals of a full wave rectifier 73. The full wave rectifier 73 has a pair of output terminals 74 and 75, the terminal 74 being connected by a conductor 76 to a junction 77 on the conductor 30. The positive output terminal 75 of the rectifier 73 is connected by means of a conductor 80 and a resistor 81 to the base electrode 53 of the transistor 51. A resistive path may be traced from a junction **34*c* on the conductor 34 to the negative supply terminal 30 which comprises in series a resistor 82, a junction 83, a resistor 84, a junction 85, and the conductor 45 through the junction 30*a* on the conductor 30. The saturable transformer 36, as disclosed in FIGURE 2, includes an additional winding 86. The upper terminal of the winding 86 is directly connected to the junction 83. The lower terminal of the winding 86 is connected through a resistor 87 to the base electrode 53 of the transistor 51. A capacitor 90 is connected in parallel with the resistor 87**.

In considering the operation of the starting circuit of FIGURE 2, let it be assumed that a D.C. potential has been applied at terminals 31 and 32 but that no oscillation has commenced in the oscillator 10. A current path may be traced from the positive supply terminal 31 through the conductor 34 to the junction **34*b*, through the transistor 51 from emitter 52 to base electrode 53, through the parallel combination of resistor 87 and capacitor 90, through the winding 86, the junction 83, the resistor 84, junction 85, and through conductor 45 to the negative supply conductor 30. This control current flowing in transistor 51 causes the small output current to flow through the transistor from the emitter 52 to the collector 54 and then through the winding 38. The current through winding 38** causes a potential to be induced on the winding 86 which is of a polarity to cause an increased base current flow in transistor 51, thereby increasing the output current of transistor 51. The transistor 51 and the associated components operate as a blocking oscillator to provide pulses or surges of bias to the input of transistor 10. The oscillator may block either due to saturation of transformer core 36 or upon capacitor 90 becoming charged. The transistor 51 will then remain blocked until the charge on capacitor 90 is dissipated through resistor 87. The blocking oscillator circuit is maintained cut off when the power oscillator 10 is operating due to a positive potential from the rectifier 73 applied through the resistor 81 to the base electrode 53 of the transistor 51.

*FIGURE 3*

Figure 3:
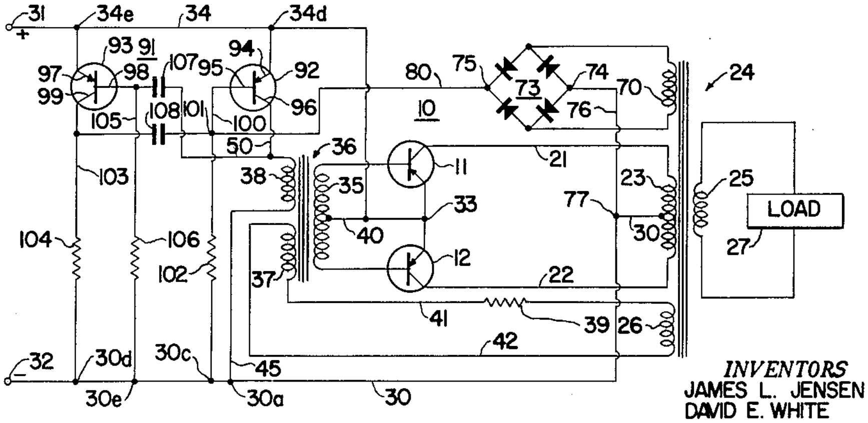
FIGURE 3 is a schematic representation of a further embodiment of our invention.

The oscillator starting circuit of FIGURE 3 is different from the circuits of FIGURES 1 and 2 in that a multivibrator is now used to excite the oscillator 10 instead of the blocking oscillator type circuit used in the FIGURES 1 and 2. Like components in FIGURE 3 are given the same identifying numerals as disclosed and described for the FIGURES 1 and 2. The description of the components carrying the same numerals will not be repeated here. In FIGURE 3 there is disclosed a multivibrator circuit 91 comprising a pair of transistors 92 and 93. The transistor 92 has an emitter electrode 94, a base electrode 95, and a collector electrode 96; the transistor 93 has an emitter electrode 97, a base electrode 98, and a collector electrode 99. The emitter electrode 94 of transistor 92 is directly connected to a junction 34*d* on the conductor 34. The collector electrode 96 is connected by the conductor 50 to the upper terminal of the winding 38 of saturating transformer 36. The base electrode 95 is connected by a conductor 100, a junction 101, a resistor 102 to a junction 30*c* on the conductor 30. The emitter electrode 97 of the transistor 93 is directly connected to a junction 34*e* on the conductor 34, and the collector electrode 99 is connected by means of a conductor 103 and a resistor 104 to a junction 30*d* on the conductor 30. The base electrode 98 is connected by means of a conductor 105 and a resistor 106 to a junction 30*e* on the conductor 30. A coupling capacitor 107 interconnects the collector electrode 96 with the base electrode 98, and a coupling capacitor 108 interconnects the collector electrode 99 with the base electrode 95. The output terminal 75 of the rectifier 73 is connected by the conductor 80 to the junction 101 in the base electrode circuit of transistor 92.

In considering the operation of the starting circuit of FIGURE 3, the multi-vibrator generally indicated at 91 operates as a free running multi-vibrator.

The multi-vibrator cycles from a condition with transistor 93 conductive to a second condition with transistor 92 conductive in a continuous fashion. Each time transistor 92 becomes conductive a pulse of current flows from the positive supply terminal 31 through the transistor 92 from emitter 94 to collector 96, through the conductor 50 and the transformer winding 38 of transformer 36, and then through conductors 45 and 30 to the negative supply terminal 32. Thus pulses of current flow in the winding 38 to provide an induced bias potential in the winding 35 to initiate oscillation of the inverter oscillator 10. The multi-vibrator 91 may be designed to operate at a repetition rate either faster or slower than the power inverter, if desired. As soon as the inverter 10 oscillates, a potential is induced on the winding 70, is rectified by the full wave rectifier 73 and the positive potential is applied through the conductor 80 to the base electrode 95 of the transistor 92. This potential is effective to disable the starting multi-vibrator at all times except when the inverter 10 is not oscillating.

*FIGURE 4*

Figure 4:
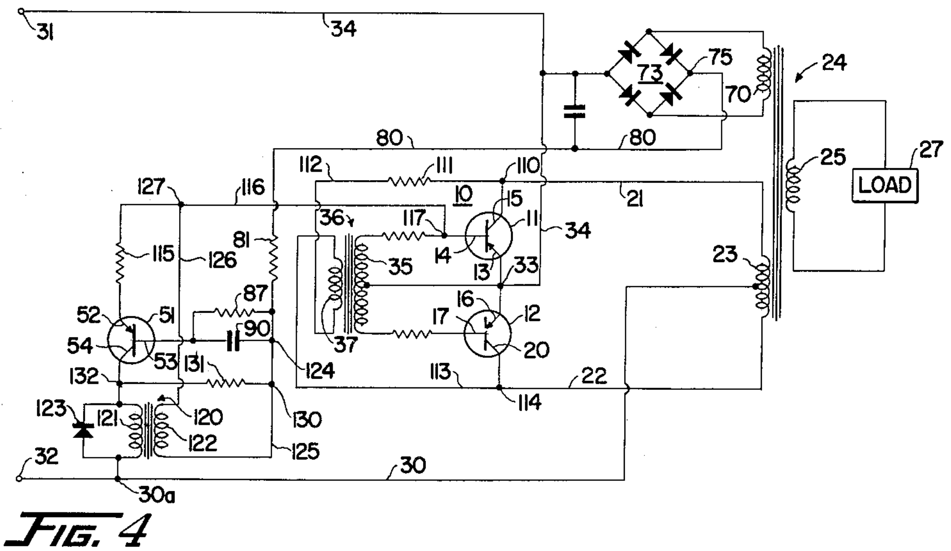
FIGURE 4 is a modification of the embodiment of FIGURE 2.

In the circuit of FIGURE 4, the feedback from the output of the oscillator to the saturating transformer 36 is from the extremes of the winding 23 rather than from an additional winding on the transformer 24. This path may be traced from a junction 110 on the conductor 21 in the collector circuit of transistor 11, through a resistor 111, a conductor 112, the primary winding 37 of the saturating transformer 36, and through a conductor 113 to a junction 114 on the conductor 22. It is now easily seen that the feedback to the winding 37 is connected directly across the terminals of the winding 23.

In FIGURE 4 the blocking oscillator is connected in a modified manner to the inverter 10. The emitter electrode 52 of the blocking oscillator transistor 51 is connected by means of a resistor 115 and a conductor 116 to a junction 117 in the base electrode circuit of transistor 11. The collector electrode 54 is connected through a primary winding 121 of a transformer 120 to the junction 30*a* on the conductor 30. The transformer 120 also includes a secondary winding 122. Semi-conductor junction rectifying means 123 are connected in parallel with the winding 121. A current path may be traced from the base electrode 53 to the emitter electrode 52 of the transistor 51, which path comprises in series a parallel combination of resistor 87 and capacitor 90, a junction 124, a conductor 125, the secondary winding 122 of transformer 120, a conductor 126 to a junction 127 on the conductor 116, through the conductor 116 and the resistor 115 to the emitter electrode 52. The junction 124 is connected by means of the resistor 81 and the conductor 80 to the positive terminal 75 of the full wave rectifier 73.

In considering the operation of the circuit of FIGURE 4, it will be noted that the modification of the oscillator 10 by coupling the feedback conductors to the saturating transformer directly across the primary winding 23 of the power transformer 24 does not affect the operation of the inverter oscillator so long as proper polarity of feedback is considered. The switching action in this oscillator is initiated when the saturating core 36 approaches saturation in the same manner as was explained for FIGURE 1.

The operation of the blocking oscillator of FIGURE 4 is somewhat different than was explained from FIGURES 1 and 2 in that the potential for energizing the blocking oscillator flows through the transistor 11. A current path may be traced from the positive supply terminal 31 through the conductor 34, a junction 33, through the transistor 11 from emitter 13 to base 14, junction 117, conductor 116, resistor 115, transistor 51 from emitter 52 to collector 54, and through a primary winding 121 of transformer 120 to the negative supply conductor 30. A D.C. base current path for the blocking oscillator transistor 51 may be traced from the base electrode 53 through the resistor 87, a conductor 125, a junction 130, the resistor 131, the junction 132, and through the transformer winding 121 to the negative supply conductor 30. When a base current begins to flow in transistor 51 thereby causing an output current to flow from the collector 54 through the primary winding 121, a potential is induced on secondary winding 122 which is of a polarity to increase the bias on the transistor 51. A current is thereby caused to flow from the upper terminal of winding 122 through the conductor 126, the junction 127, the resistor 115, from emitter to base electrode of transistor 51 through the capacitor 90 and back to the lower terminal of the secondary winding 122. This increased bias is effective to return the transistor 51 to a high conducting state for a short period of time. The blocking oscillator type circuit may be cut off by various methods which may be for example the capacitor 90 becoming fully charged. It will be realized that the resistors 87 and 131 are sufficiently large so that full conduction of the transistors cannot be sustained by the D.C. current flowing therethrough. Upon the discharge of capacitor 90 through the resistor 87, the pulsing of the blocking oscillator type circuit may be repeated. It will be noted that with each pulse of current flowing in the transistor 51, an input current is caused to flow in the transistor 11 from the emitter electrode 13 to the base electrode 14 thereby pulsing the transistor 11 to an on state to initiate conduction in the oscillator 10. When the oscillator inverter 10 is operative a potential will developed at the output terminal 75 of the rectifier 73 which is coupled by the conductor 80 and the resistor 81 to the biasing circuit of the transistor 51. This potential is effective to bias the blocking oscillator circuit to cut off during periods when the main inverter oscillator 10 is operative.

Figure 5:
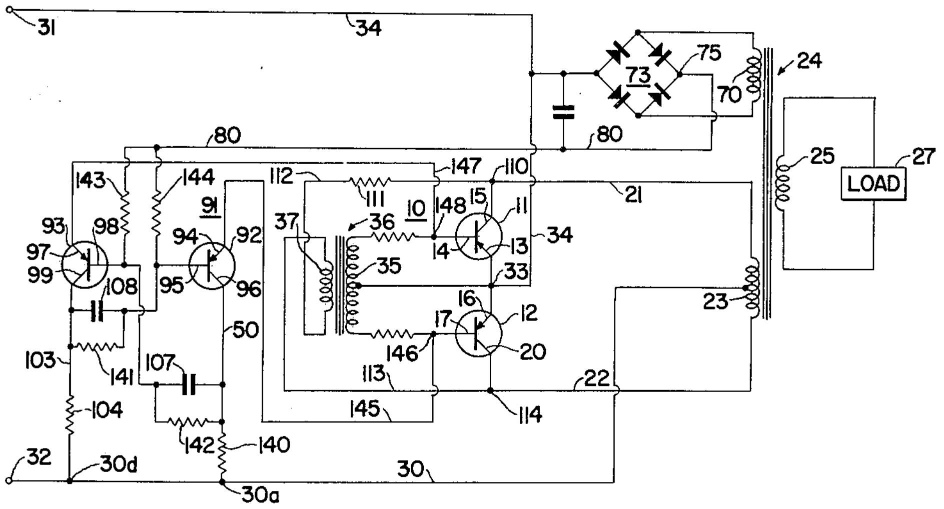
FIGURE 5 is a modification of the embodiment shown in FIGURE 3.

*Figure 5*

FIGURE 5 is a modification of the circuit of FIGURE 3 and discloses a multi-vibrator starting circuit for the inverter 10, where the multi-vibrator terminals are directly coupled into the base electrodes of the inverter 10. The multi-vibrator 91 of FIGURE 5 is in many respects similar to the multi-vibrator of FIGURE 3; however there are several important modifications which will be mentioned below. The collector electrode 96 of transistor 92 is connected by the conductor 50 and a resistor 140 to the junction 30*a* on the conductor 30. The capacitor 108 which is connected intermediate the collector electrode 99 of transistor 93 and the base electrode 95 of transistor 92 has connected in parallel therewith a bias resistor 141. Likewise, a bias resistor 142 is connected in parallel with the capacitor 107 which directly interconnects the collector electrode 96 with the base electrode 98. A resistor 143 connects the base electrode 98 to the conductor 80 which is connected to the positive terminal of the rectifier 73. A like resistor 144 connects the base electrode 95 to the conductor 80. The emitter electrode 94 of transistor 92 is connected by a conductor 145 to a junction 146 in the base electrode circuit 17 of transistor 12. Likewise, the emitter electrode 97 is connected by a conductor 147 to a junction 148 in the base electrode circuit of the transistor 11.

In considering the operation of FIGURE 5, it will be noted that the current path of the multi-vibrator transistors flows through the input circuit of the inverter transistors. For example, a current path may be traced from the positive terminal 31 through the conductor 34, the junction 33, the emitter electrode 16 to the base electrode 17 of transistor 12, to junction 146, conductor 145, to the transistor 92, and through the transistor 92 from the emitter 94 to collector 96, conductor 50 and through the resistor 140 to the negative supply conductor 30. Likewise, the output current for transistor 93 flows through the emitter base path of inverter transistor 11. When the inverter 10 is not oscillating, the multi-vibrator 91, which is free running, will continuously change from a state where transistor 93 is conductive to a succeeding state where transistor 92 is conductive. The periodic conduction of the multi-vibrator transistors will cause pulses to flow in the emitter base circuits of transistors 11 and 12 alternately to render these last named transistors conductive to initiate oscillation of the inverter. Immediately upon oscillation commencing to the inverter, the induced voltage on transformer winding 70 will be rectified by the full wave rectifier 73 and applied through the conductor 80 and the resistors 143 and 144 to maintain the multi-vibrator 91 cut off. If at any time the oscillation ceases, the biasing voltage to the multi-vibrator will be removed, and the multi-vibrator will again pulse to initiate oscillation in the inverter.

Many changes and modifications of this invention will undoubtedly occur to those who are skilled in the art and we therefore wish it to be understood that we intend to be limited by the scope of the appended claims and not by the specific embodiments of our invention which are disclosed herein for purposes of illustration only.

We claim:

1. Starting apparatus for semi-conductor oscillators comprising in combination: semi-conductor power oscillator means having output terminals for providing an alternating type current output to a load device; means connecting said semi-conductor oscillator means to a source of direct current potential for energizing said oscillator means; further semi-conductor oscillatory type means having an output circuit connected to the input of said power oscillator means, said further semi-conductor means being operative to provide a periodic pulsating current to said semi-conductor power oscillator means to initiate oscillation therein; and bias means connected to the input of said further semi-conductor means and responsive to oscillation of said power oscillator means for rendering said further semi-conductor oscillatory type means inoperative only when said power oscillator means is oscillating.

2. Starting apparatus for semi-conductor oscillators comprising in combination: transistor power oscillator means having output terminals for providing an alternating type current output to a load device; means connecting said transistor oscillator means to a source of direct current potential for energizing said oscillator means; further transistor oscillatory type means having an output circuit connected to the input of said power oscillator means, said further transistor means being operative to provide a periodic pulsating current to said transistor power oscillator means to initiate oscillation therein; and bias means connected to the input of said further transistor means and responsive to oscillation of said power oscillator means for rendering said further transistor oscillatory type means inoperative only when said power oscillator means is oscillating.

3. Starting apparatus for semi-conductor inverters comprising in combination: semi-conductor potential inverter means for converting a direct current potential to an alternating current type potential comprising a pair of semi-conductor amplifying devices having input means, output means adapted to be connected to load means, and having regenerative feedback means connected from said output means to said input means; circuit means connecting said inverter means to a source of direct current potential; further semi-conductor oscillatory type means having an output circuit connected to the input means of said semi-conductor inverter means, said further semi-conductor oscillatory type means being operative to provide a periodic pulsating current to said semi-conductor inverter means to initiate oscillation therein; and bias means connected to and energized by the output of said inverter means, said bias means being also connected to said further oscillatory type means for rendering said further oscillatory type means inoperative when said inverter means is operative.

4. Starting apparatus for semi-conductor inverters comprising in combination: transistor potential inverter means for converting a direct current potential to an alternating current type potential comprising a pair of transistor amplifying devices having input means, output means adapted to be connected to load means, and having regenerative feedback means connected from said output means to said input means; circuit means connecting said inverter means to a source of direct current potential; further transistor oscillatory type means having an output circuit connected to the input means of said transistor inverter means, said further transistor oscillatory type means being operative to provide a periodic pulsating current to said transistor inverter means to initiate oscillation therein; and bias means connected to and energized by the output of said inverter means, said bias means being also connected to said further oscillatory type means for rendering said further oscillatory type means inoperative when said transistor inverter means is operative.

5. Starting apparatus for semi-conductor inverters comprising in combination: transistor inverter means for converting a direct current potential to an alternating current potential, said means including a pair of transistors, each of said transistors having input and output electrodes; output means; a source of direct current potential; means including said output means connecting said source of potential to said output electrodes; feedback means including saturable impedance means connected from the output means to the input electrodes of said transistors, said saturable feedback means controlling the bias to said transistors so that the transistors are alternately made conductive; transistor oscillatory type means having an output circuit connected to the input of said inverter means, said oscillatory means being operative to provide a periodic pulsating current to said transistor inverter means to initiate oscillation therein; and bias means connected to and energized by the output of said transistor inverter means, said bias means also being connected to said transistor oscillatory type means for rendering said oscillatory means inoperative when said inverter means is oscillating.

6. Starting apparatus for semiconductor potential inverters comprising in combination: transistor inverter means for converting a direct current potential to an alternating current potential, said means comprising a pair of push-pull connected transistors, each of said transistors having input and output electrodes; output means connected to said output electrodes and energized when said inverter means is oscillating; regenerative feedback means connected from the output of said inverter means to the input electrodes of said transistors; transformer means in said feedback means; said transformer means having a plurality of magnetically coupled windings; transistor oscillatory type means having an output circuit connected to one of said plurality of windings, said oscillatory means being operative to provide a periodic pulsating current to the input electrodes of said inverter means through said transformer means to initiate oscillation in said inverter means; and bias producing means energized by the output of said transistor inverter means, the output of said bias producing means being connected to said transistor oscillatory type means rendering said oscillatory means inoperative when said inverter means is oscillating.

7. Starting apparatus for semiconductor potential inverters comprising in combination: transistor inverter means for converting a direct current potential to an alternating current potential, said means comprising a pair of transistors, each of said transistors having input and output electrodes; output means connected to said output electrodes and energized when said inverter means is oscillating; regenerative feedback means connected from the output of said inverter means to the input electrodes of said transistors; blocking oscillator means having an output circuit connected to the input circuit of said inverter means, said blocking oscillator means being operative to provide a periodic pulsating current to said transistor input electrodes to initiate oscillation in said inverter means; and bias producing means energized by the output of said transistor inverter means, the output of said bias producing means being connected to said transistor blocking oscillator means for rendering said blocking oscillator means inoperative when said inverter means is oscillating.

8. Starting apparatus for semiconductor potential inverters comprising in combination: transistor inverter means for converting a direct current potential to an alternating current potential, said means comprising a pair of transistors, each of said transistors having input and output electrodes; output means connected to said output electrodes and energized when said inverter means is oscillating; regenerative feedback means connected from the output of said inverter means to the input electrodes of said transistors; transistor multi-vibrator means having an output circuit connected to the input circuit of said inverter means, said transistor multi-vibrator means being operative to provide a periodic pulsating current to said transistor input electrodes to initiate oscillation in said inverter means; and bias producing means energized by the output of said transistor inverter means, the output of said bias producing means being connected to said transistor multi-vibrator means for rendering said multi-vibrator means inoperative when said inverter means is oscillating.

9. Starting apparatus for semiconductor inverters comprising in combination: semiconductor potential inverter means for converting a direct current potential to an alternating current type potential comprising: semiconducting amplifying means having an input circuit, an output circuit adapted to be connected to a load means, and having regenerative feedback means connected from said output circuit to said input circuit; circuit means connecting said inverter means to a source of direct current potential; periodic current pulse generating means having an output circuit connected to the input circuit of said semiconductor inverter means, said periodic current pulse generating means being operative to provide a periodic pulsating current to said semiconductor inverter means to initiate oscillation therein; and bias means connected to and energized by the output of said inverter means, said bias means being also connected to said periodic current pulse generating means for rendering said current pulse generating means inoperative when said inverter means is operative.

10. In a transistor inverter circuit including a pair of transistors connected with a transformer so as to convert a direct current voltage source into alternating current voltage and including emitter, base and collector electrodes, the improvement for effecting positive starting and protecting from circuit overloads comprising: a first current path connected between said base electrodes and said source, a second current path connected in parallel with said first path and including a transistor having input, output and control electrodes, said input and output electrodes connected to be forward and reversed biased respectively, means connected to said control electrode to automatically isolate said transistor from said inverter circuit a predetermined time after said direct current voltage is applied thereto.

11. A transistor inverter circuit comprising:

first and second transistors each having input, output and control electrodes, a source of potential, said input electrodes being interconnected and returned to said source, transformer means including first and second windings, said output electrodes being interconnected through said first winding and returned to said source, feedback means connected to said control electrodes, first and second current paths, means for connecting said current paths between said control electrodes and said source of potential, said first current path including a third transistor having an emitter, a collector and a base, said collector being connected to a first terminal of said source for reverse biasing it, means including said second current path for connecting said emitter to a second terminal of said source for forward biasing it, and means connected between said terminals and to said base for biasing said third transistor to cut off a predetermined time after application of potential thereto.

12. A transistor inverter circuit as defined in claim 11 wherein said second current path includes a resistor and said means for biasing said third transistor to cut off includes a resistor and a capacitor connected in series between said terminals and said base of said third transistor is connected to a common point between said resistor and capacitor.

13. A transistor inverter circuit as defined in claim 11 wherein said first current path includes a first resistor connected between said emitter and said feedback means, said second current path includes a second resistor, and said means for biasing said third transistor to cut off includes a capacitor connected in series with said first and second resistors and between said terminals.

14. In a transistor inverter circuit including a pair of transistors connected with a transformer so as to convert a direct current voltage source into alternating current voltage and including emitter, base and collector electrodes, the improvement for effecting positive starting and protecting from circuit overloads comprising:

a third transistor including a third emitter, third collector and third base, means for connecting said third emitter to one of said base electrodes, said third collector being connected to a first terminal of said source, a first resistor and a capacitor connected in series across said source said third base being connected to a common point between said resistor and capacitor, and second resistor means connected between said base electrodes of said inverter circuit and a second terminal of said source.

15. Starting apparatus for semiconductor direct current to alternating current inverters comprising in combination:

first transistor oscillator means for converting a direct current potential to an alternating current potential, said oscillator means requiring a starting current be applied thereto to assure initiation of oscillation, said means comprising a pair of transistors, each of said transistors having input and output electrodes;

output means;

a source of direct current potential;

means including said output means connecting said source of potential to said output electrodes;

feedback means including saturable impedance means connected from the output means to the input electrodes of said transistors, said saturable feedback means controlling the bias to said transistors so that the transistors are alternately made conductive;

and second oscillatory type means for generating starting pulses having an output circuit connected to the input of said first oscillator means, said second oscillatory means being operative to provide a periodic pulsating current to said first transistor oscillator means as long as said transistor oscillator is not oscillating, said periodic pulsating current being applied to said inverter means in a direction to initiate oscillation therein.

16. Starting apparatus for semiconductor direct current to alternating current potential inverters comprising in combination:

first transistor oscillator inverter means for converting a direct current potential to an alternating current potential, said oscillator means requiring a starting current be applied thereto to assure initiation of oscillation, said means comprising a pair of push-pull connected transistors, each of said transistors having input and output electrodes;

output means connected to said output electrodes and energized when said oscillator inverter means is oscillating;

regenerative feedback means connected from the output of said oscillator inverter means to the input electrodes of said transistors;

transformer means in said feedback means, said transformer menas having a plurality of magnetically coupled windings;

and oscillatory type current pulse generating means having an output circuit connected to one of said plurality of windings, said oscillatory means being operative to provide a periodic pulsating current to the input electrodes of said oscillator inverter means through said transformer means, said oscillatory means being connected to said inverter means in a direction such that said periodic pulsating current is effective to initiate oscillation in said oscillator inverter means.

17. Starting apparatus for semiconductor potential inverters comprising in combination:

transistor oscillator inverter means for converting a direct current potential to an alternating current potential, said oscillator means requiring a starting current be applied thereto to assure the initiation of oscillation, said means comprising a pair of push-pull connected transistors, each of said transistors having input and output electrodes;

output means connected to said output electrodes and energized when said oscillator inverter means is oscillating;

regenerative feedback means connected from the output of said oscillator inverter means to the input electrodes in said transistors;

transformer means in said feedback means;

and blocking oscillator means having an output circuit connected to said transformer means, said blocking oscillator means being operative to provide a periodic pulsating current through said transformer means to said transistor input electrodes, said oscillator means being connected to said inverter means in a direction such that said periodic pulsating current is effective to initiate oscillation in said oscillator inverter means.

18. Starting apparatus for semiconductor potential inverters comprising in combination:

transistor oscillator inverter means for converting a direct current potential to an alternating current potential, said oscillator means requiring a starting current be applied thereto to assure initiation of oscillation, said means comprising a pair of transistors, each of said transistors having input and output electrodes;

output means connected to said output electrodes and energized when said oscillator inverter means is oscillating;

regenerative feedback means connected from the output of said inverter means to the input electrodes of said transistors;

and blocking oscillator means having an output circuit connected to the input circuit of said oscillator inverter means, said blocking oscillator means being operative to provide a periodic pulsating current to said transistor input electrodes, said oscillator means being connected in a direction such that said periodic pulsating current is effective to initiate oscillation in said oscillator inverter means.

19. Starting apparatus for semiconductor potential inverters comprising in combination:

transistor oscillator inverter means for converting a direct current potential to an alternating current potential, said oscillator means requiring a starting current be applied thereto to assure initiation of oscillation, said means including a pair of transistors, each of said transistors having a plurality of electrodes including output electrodes and a control electrode;

output means;

a source of direct current potential;

means including said output means connecting said source of potential to said output electrodes of said transistors;

regenerative feedback means connected from the output of said oscillator inverter means to the control electrodes of said transistors;

and transistor blocking oscillator means comprising a transistor having an output circuit connected to the control electrode of at least one of said transistors, said blocking oscillator means being operative to provide a periodic pulsating current to said transistor control electrode, said oscillator means being connected to said control electrode in such a manner that said periodic pulsating current is in a direction to initiate oscillation in said oscillator inverter means.

20. Starting apparatus for semiconductor potential inverters comprising in combination:

transistor oscillator means for converting a direct current potential to an alternating current potential, said oscillator means requiring a starting current be applied thereto to assure initiation of oscillation, said means comprising a pair of push-pull connected transistors, each of said transistors having input and output electrodes;

output means connected to said output electrodes and energized when said oscillator means is oscillating;

regenerative feedback means connected from the output of said oscillator means to the input electrodes of said transistors;

transformer means in said feedback means;

and transistor multivibrator means having an output circuit connected to said transformer means, said transistor multivibrator means being operative to provide a periodic pulsating current through said transformer means to said transistor input electrodes, said multivibrator means being connected to said transformer means in such a manner that said periodic pulsating current is effective to initiate oscillation in said oscillator means.

21. Starting apparatus for semiconductor potential inverters comprising in combination:

transistor oscillator means for converting a direct current potential to an alternating current potential, said oscillator means requiring a starting current be applied thereto to assure initiation of oscillation, said means comprising a pair of transistors, each of said transistors having input and output electrodes;

output means connected to said output electrodes and energized when said oscillator means is oscillating;

regenerative feedback means connected from the output of said oscillator means to the input electrodes of said transistors;

and transistor multivibrator means having an output circuit connected to the input circuit of said oscillator means, said transistor multivibrator means being operative to provide a periodic pulsating current to said transistor input electrodes, said multivibrator means being connected in a direction so that said periodic pulsating current is effective to initiate oscillation in said oscillator means.

22. Starting apparatus for semiconductor potential inverters comprising in combination:

transistor oscillator means for converting a direct current potential to an alternating current potential, said oscillator means requiring a starting current be applied thereto to assure initiation of oscillation, said means including a pair of tansistors, each of said transistors having a plurality of electrodes including output electrodes and a control electrode;

output means;

a source of direct current potential;

means including said output means connecting said source of potential to said output electrodes of said transistors;

regenerative feedback means connected from the output of said oscillator means to the control electrodes of said transistors;

and transistor multivibrator means comprising transistors having an output circuit connected to the control electrode of at least one of said oscillator means transistors, said multivibrator means being operative to provide a periodic pulsating current to said transistor control electrode, said periodic pulsating current to said control electrode being in a direction to initiate oscillation in said oscillator means.

References Cited in the file of this patent

UNITED STATES PATENTS

| | | |
|---|---|---|
| 2,460,637 | Huge | Feb. 1, 1949 |
| 2,476,997 | Noyes | July 26, 1949 |
| 2,643,340 | Lawrence | June 23, 1953 |
| 2,676,251 | Scarbrough | Apr. 20, 1954 |
| 2,745,012 | Felker | May 8, 1956 |
| 2,768,294 | Van Overbeek | Oct. 23, 1956 |
| 2,774,878 | Jensen | Dec. 18, 1956 |
| 2,783,380 | Bonn | Feb. 26, 1957 |
| 2,783,384 | Bright et al. | Feb. 26, 1957 |
| 2,854,582 | Gyton | Sept. 30, 1958 |